United States Patent
Depew et al.

(10) Patent No.: US 8,418,005 B2
(45) Date of Patent: Apr. 9, 2013

(54) METHODS, APPARATUS AND ARTICLES OF MANUFACTURE TO DIAGNOSE TEMPERATURE-INDUCED MEMORY ERRORS

(75) Inventors: Kevin G. Depew, Spring, TX (US); Andrew Brown, Houston, TX (US); John S. Harsany, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 330 days.

(21) Appl. No.: 12/775,307

(22) Filed: May 6, 2010

(65) Prior Publication Data

US 2011/0276845 A1  Nov. 10, 2011

(51) Int. Cl.
*G11C 29/08* (2006.01)
*G01R 31/28* (2006.01)

(52) U.S. Cl. .......... 714/721; 714/718; 714/733

(58) Field of Classification Search .......... 714/718, 714/721, 733
See application file for complete search history.

(56) References Cited

U.S. PATENT DOCUMENTS

| 5,890,100 | A | | 3/1999 | Crayford |
| 5,956,350 | A | * | 9/1999 | Irrinki et al. .......... 714/718 |
| 6,085,334 | A | * | 7/2000 | Giles et al. .......... 714/6.32 |
| 6,574,763 | B1 | * | 6/2003 | Bertin et al. .......... 714/738 |
| 7,304,905 | B2 | | 12/2007 | Hsu et al. |
| 7,444,490 | B2 | * | 10/2008 | Cases et al. .......... 711/167 |
| 7,458,000 | B2 | * | 11/2008 | Gorman et al. .......... 714/733 |
| 7,480,586 | B2 | | 1/2009 | Johns et al. |
| 7,496,817 | B2 | * | 2/2009 | Liu et al. .......... 714/733 |
| 7,689,887 | B2 | * | 3/2010 | Gorman et al. .......... 714/745 |
| 7,765,825 | B2 | * | 8/2010 | Wyatt .......... 62/259.2 |
| 7,861,138 | B2 | * | 12/2010 | Oh .......... 714/763 |
| 8,028,198 | B2 | * | 9/2011 | Resnick .......... 714/42 |
| 8,097,836 | B2 | * | 1/2012 | Raterman .......... 219/497 |
| 2007/0140030 | A1 | | 6/2007 | Wyatt |
| 2008/0103634 | A1 | | 5/2008 | Santos et al. |

OTHER PUBLICATIONS

STMicroelectronics, "Memory module temperature sensor with a 2Kb SPD EEPROM," Aug. 2007 (7 pages).
Intel, "System Memory Power and Thermal Management in Platforms Built on Intel Centrino Duo Mobile Technology," Intel Technology Journal, vol. 10, Issue 2, May 15, 2006 (3 pages).

* cited by examiner

*Primary Examiner* — James C Kerveros

(57) ABSTRACT

Example methods, apparatus and articles of manufacture to diagnose temperature-induced memory errors are disclosed. A disclosed example method to diagnose a temperature-induced memory error includes detecting a memory error associated with a memory device, and writing a highest measured temperature of the memory device in the memory device when the memory error is detected, the highest temperature measured temporally near the detected memory error.

13 Claims, 7 Drawing Sheets

METHODS, APPARATUS AND ARTICLES OF MANUFACTURE TO DIAGNOSE TEMPERATURE-INDUCED MEMORY ERRORS

BACKGROUND

Memory devices (e.g., a dual in-line memory module (DIMM)) have a high warranty return rate. However, returned memory devices also have a very high "no fault found" rate in which the manufacture is unable to duplicate a reported failure.

DETAILED DESCRIPTION

Memory devices have higher failure rates at higher temperatures and there is a specific temperature at which a memory device is not guaranteed to maintain data integrity. It is not uncommon for memory errors to be caused by temperature issues rather than an actual problem with the memory device.

Example methods, apparatus and articles of manufacture to diagnose temperature-induced memory errors are disclosed. A disclosed example method to diagnose a temperature-induced memory error includes detecting a memory error associated with a memory device, and writing a highest measured temperature of the memory device in the memory device when the memory error is detected, the highest temperature measured temporally near the detected memory error.

A disclosed example apparatus to diagnose a temperature-induced memory error includes a memory, a memory controller to identify the memory associated with a detected memory error, and a hardware interface processor comprising a poller to obtain temperatures of the memory device, a queue to store the measured temperatures, and an error handler to write the highest measured temperature stored in the queue in the memory device when a memory error is detected.

While example methods, apparatus and articles of manufacture to diagnose temperature-induced memory errors are described herein, persons of ordinary skill in the art will readily appreciate that the example methods, apparatus and articles of manufacture may additionally or alternatively be used to diagnose temperature-induced errors in any number and/or type(s) other device(s) and/or component(s). Other example devices and components include, but are not limited to, a microprocessor, a graphic processor, a storage device, a hard drive, an optical drive, a network interface, etc. Moreover, while a processor, a memory controller and a baseboard management controller described herein operate cooperatively to diagnose temperature-induced memory errors described herein, persons of ordinary skill in the art will readily appreciate that a single processor, controller and/or microcontroller could be used to implement the examples disclosed herein.

Figure 1:
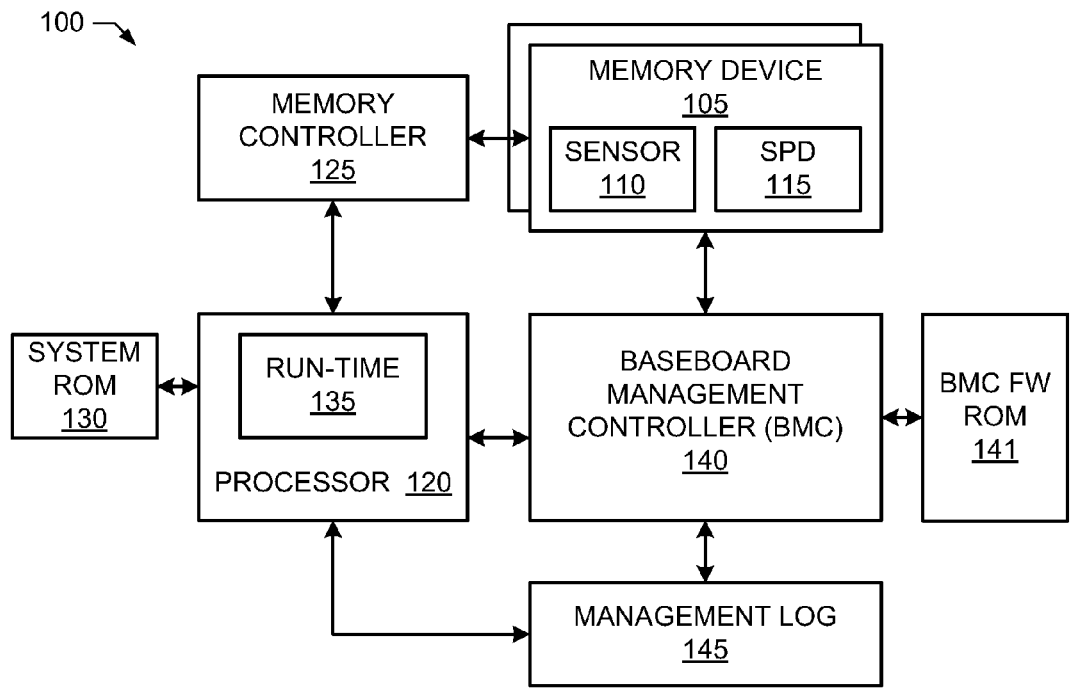
FIG. 1 is a schematic illustration of an example computer which is structured to diagnose temperature-induced memory errors.

FIG. 1 illustrates an example computer 100 which is structured to diagnose temperature-induced memory errors in any number and/or type(s) of memory devices, one of which is designated at reference numeral 105. Although for ease of illustration only two memory devices 105 are shown in FIG. 1, any number of memory devices 105 may be present. The example computer 100 may be any type of computing device such as a personal computer (e.g., a desktop, a laptop, etc.), a workstation, a server, a set-top box, a gaming device, etc. An example memory device 105 is a dual in-line memory module (DIMM) that includes any type of temperature sensor 110 and non-volatile storage 115. While in the illustrated example of FIG. 1, the non-volatile storage 115 is implemented by one or more non-volatile serial presence detect (SPD) bytes 115, any number and/or type(s) of non-volatile memory(-ies) and/or non-volatile memory device(s) may be used to implement the non-volatile storage 115. The example temperature sensor 110 of FIG. 1 can be read by other devices of the computer 100 to obtain a reading and/or measurement of the current operating temperature of the memory device 105. The example SPD bytes 115 of FIG. 1 includes, among other things, values that represent what type and/or how much memory is implemented by the memory device 105, and/or what timings to use to access the memory. The example SPD bytes 115 of FIG. 1 also include one or more non-volatile bytes that may be used to store temperature data and/or other data (e.g., manufacturer specific data).

To control the operation of the computer 100, the computer 100 is provided with a processor 120. The example processor 120 of FIG. 1 may be implemented by any desired type of processing device such as a processor core, a processor and/or a microcontroller. Alternatively, the example processor 120 may implement any number and/or type(s) of processor cores and/or controllers.

To enable the processor 120 to read data from and/or write data to the example memory device 105, the example computer 100 of FIG. 1 includes any number and/or type(s) of memory controllers, one of which is designated at reference numeral 125. While the example memory controller 125 of FIG. 1 is depicted separately from the example processor 120, the memory controller 125 may alternatively be implemented by and/or within the processor 120.

When the example computer 100 of FIG. 1 is initialized, the example processor 120 loads or reads machine-accessible instructions from a system read-only memory (ROM) 130 and begins executing the instructions as a run-time module 135. The example system ROM 130 of FIG. 1 is sometimes referred to in the industry as the basic input/output system (BIOS). The system ROM 130 includes boot firmware designed to be the first machine-accessible instructions executed by the processor 120 when powered on. An initial function of the example run-time module 135 of FIG. 1 is to identify, test, and/or initialize system devices such as a video display card, a hard disk, a floppy disk and/or other hardware. The example run-time module 135 also sets the computer 100 to a known state, so that other machine-accessible instructions stored on any number and/or type(s) of additional machine-accessible storage device(s), memory device(s) and/or memory(-ies) can be loaded, executed, and given control of the computer 100. Additionally, the example run-time module 135 of FIG. 1 enables the processor 120 to interact with, among other things, the example memory controller 125, a baseboard management controller (BMC) 140 and/or a management and/or event log 145.

Figure 2:
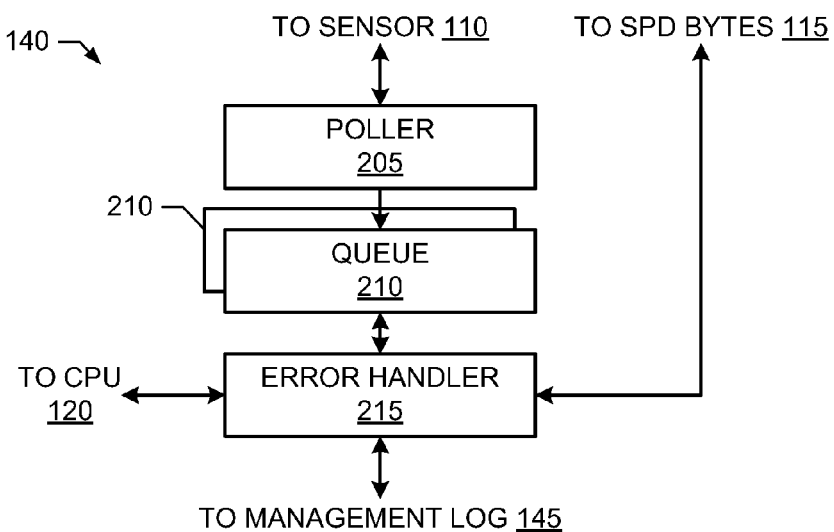
FIG. 2 illustrates an example manner of implementing a portion of the example baseboard management controller (BMC) of FIG. 1 to log temperature-induced memory error information.

The example BMC 140 of FIG. 1 executes BMC firmware stored in an example ROM 141 and implements an interface between the processor 120 and other components of the computer 100. The example ROM 141 may be implemented using, for example, a FLASH memory and/or FLASH memory device. An example manner of implementing a portion of the example BMC 140 of FIG. 1 to log temperature-induced memory error information is illustrated in FIG. 2. The example BMC 140 implements, among other things, a poller 205 (FIG. 2) to periodically (e.g., approximately every 1 second) and/or aperiodically read temperatures measured by any number and/or type(s) of temperature sensors, including, but not limited to, the example temperature sensor 110. Measured temperatures of each of the memory devices 105 are stored in a corresponding queue 210 (FIG. 2). Although for ease of illustration only two queues 100 are shown in FIG. 2, any number of queues 100 may be employed. For example, a queue 210 may be present for each memory device 105 to be monitored. In some examples, each queue 210 holds temperature values measured over a moving 10 second interval for its corresponding memory device 105. Using one or more measured temperatures, including, but not necessarily limited to, the temperature(s) of the memory device 105, the example BMC 140 implements thermal monitoring and/or fan speed control. In the example of FIG. 1, the BMC 140 is implemented separately from the example processor 120. However, the BMC 140 may alternatively be implemented within the processor 120 (e.g., as a separate processor core within the processor 120).

The example event and/or management log 145 of FIG. 1 is a non-volatile log containing a description of each system event, its class and severity, the date and time of its first occurrence and most recent update, and the number of times the event has occurred. For example, the management log 145 may be used to store and/or retain information concerning detected memory errors together with corresponding temperatures of the memory device(s) 105 associated with the detected memory errors.

When a correctable and/or uncorrectable memory error is detected, the example run-time module 135 executing on the example processor 120 of FIG. 1 interacts with the example memory controller 125 to identify the memory device(s) 105 associated with the detected memory error. As described above, the run-time module 135 implements firmware and/or software stored in the example system ROM 130. The example run-time module 135 notifies the example BMC 140 of the detected memory error. In some examples, the memory error notification identifies the affected memory device(s), an error and/or failure type, and a flag indicating that temperature information should be logged.

When the example BMC 140 receives a notification of a memory error, an error handler 215 (FIG. 2) identifies the highest measured temperature in each of the queue(s) 210 corresponding to the memory device(s) 105 associated with the detected memory error, and stores or writes the highest measured temperature(s) in one or more SPD bytes 115 of the corresponding memory device(s) 105. The highest measured temperature may be stored in an original equipment manufacturer (OEM) defined SPD byte 115. The example error handler 215 of FIG. 2 also adds to the management log 145 an entry corresponding to the detected memory error. An example entry includes the identifier(s) of the affected memory device(s) 105, the error and/or failure type, and one or more temperatures associated with the error. In some examples, the highest measured temperature contained in the queue 210 is written to the log 145. Additionally or alternatively, all or the most recent temperatures contained in the queue 210 are written to the log 145.

Because the highest measured temperature(s) associated with potential temperature-induced memory errors are written to the non-volatile SPD bytes 115, memory errors associated with the memory device 105 can be diagnosed for temperature-induced memory errors. For example, the highest measured temperature written in the SPD bytes 115 can be compared with the maximum specified operating temperature for the memory device 105. If the highest measured temperature exceeds the maximum specified operating temperature, the detected memory errors are likely due to temperature-induced memory errors if no other identified memory device failures can be identified (i.e., if the memory device 105 operates correctly during testing under proper temperature conditions). Because the temperature information is stored in the non-volatile SPD bytes 115, the diagnosis of temperature-induced memory errors can occur without having to access the computer 100 and/or access the management log 145. That is, only the potentially faulty memory devices 105 need to be returned to a service location and/or manufacturing facility for testing and requalification. If the highest measured temperature exceeds the maximum specified temperature and testing does not reveal any other memory errors, the technician can conclude with high confidence that the memory error was due to high temperature allowing the memory device 105 to be returned to service. In the absence of such highest measured temperature information, the memory device 105 may have to be discarded, and/or access to the computer 100 and/or the log 145 obtained to determine whether the memory is truly faulty. However, access to the computer 100 and/or the log 145 may not be feasible, possible and/or permitted by the customer. Moreover, the occurrence of such thermally-induced events can be used to identify platform-based thermal issues or problems. Thus, having highest measured temperature information stored in the memory device enables otherwise non-obtainable manufacturing efficiencies.

While an example computer 100 has been illustrated in FIGS. 1 and 2, one or more of the interfaces, data structures, elements, processes and/or devices illustrated in FIG. 1 and/or FIG. 2 may be combined, divided, re-arranged, omitted, eliminated and/or implemented in any other way. Further, the example memory device(s) 105, the example sensor 110, the SPD bytes 115, the example processor 120, the example memory controller 125, the example system ROM 130, the example run-time module 135, the example BMC 140, the example management log 145, the example poller 205, the example queue(s) 210, and/or the example error handler 215 and/or, more generally, the example computer 100 may be implemented by hardware, software, firmware and/or any combination of hardware, software and/or firmware. Thus, for example, any of the example memory device(s) 105, the example sensor 110, the SPD bytes 115, the example processor 120, the example memory controller 125, the example system ROM 130, the example run-time module 135, the example BMC 140, the example management log 145, the example poller 205, the example queue(s) 210, and/or the example error handler 215 may be implemented by one or more circuit(s), programmable processor(s), application-specific integrated circuit(s) (ASIC(s)), programmable logic device(s) (PLD(s)), field-programmable logic device(s) (FPLD(s)), and/or field-programmable gate array(s) (FPGA(s)), etc. When any apparatus claim of this patent incorporating one or more of these elements is read to cover a purely software and/or firmware implementation, at least one of the example memory device(s) 105, the example sensor 110, the SPD bytes 115, the example processor 120, the example memory controller 125, the example system ROM 130, the example run-time module 135, the example BMC 140, the example management log 145, the example poller 205, the example queue(s) 210, and/or the example error handler 215 are hereby expressly defined to include a tangible computer-readable medium storing the firmware and/or software. Further still, the example computer 100 may include interfaces, data structures, elements, processes and/or devices instead of, or in addition to, those illustrated in FIGS. 1 and 2 and/or may include more than one of any or all of the illustrated interfaces, data structures, elements, processes and/or devices. Additionally, although FIGS. 1 and 2 have been described in conjunction with the computer 100, any other processor-based device may be implemented in place of the computer 100.

Figure 3:
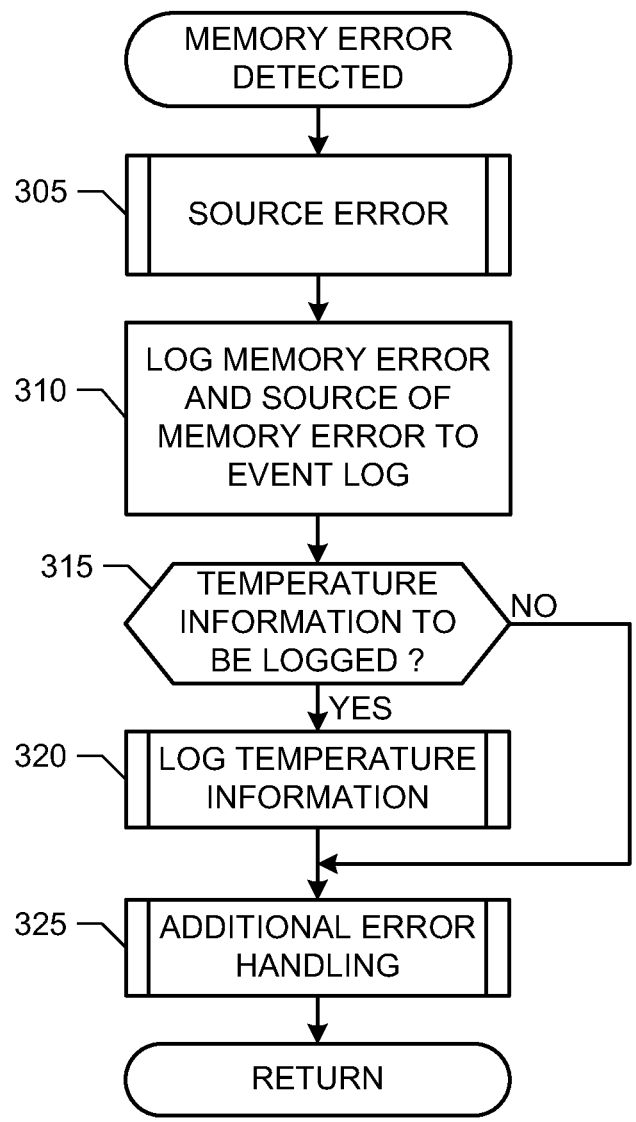
FIG. 3 is representative of example machine-accessible instructions that may be executed by, for example, one or more processors, to detect and log temperature-induced memory error information and/or to implement the example computer of FIG. 1.
Figure 4:
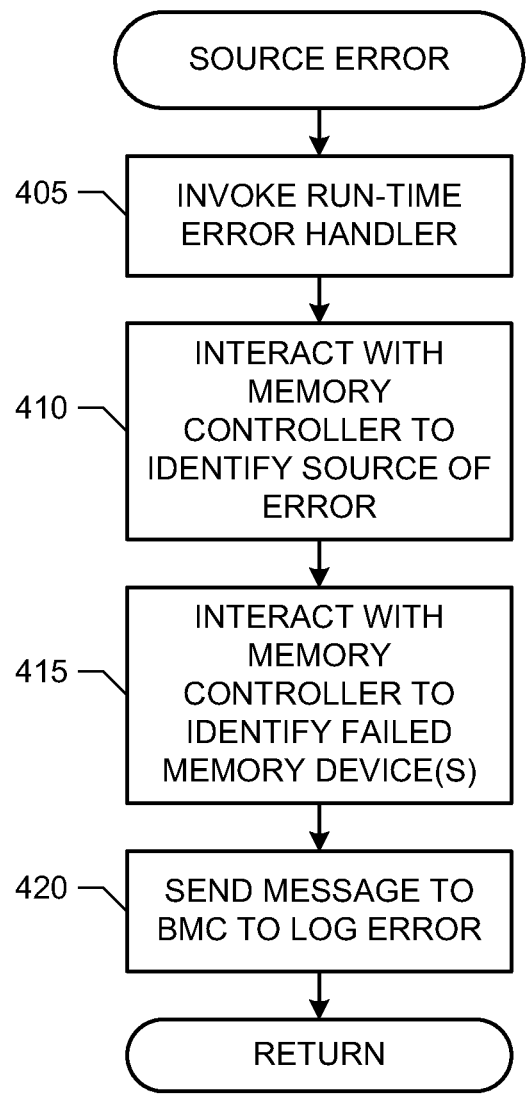
FIG. 4 is representative of example machine-accessible instructions that may be executed by, for example, one or more processors, to source a detected memory error and trigger the logging of associated temperature information, and/or to implement a portion of the example run-time module of FIG. 1
Figure 5:
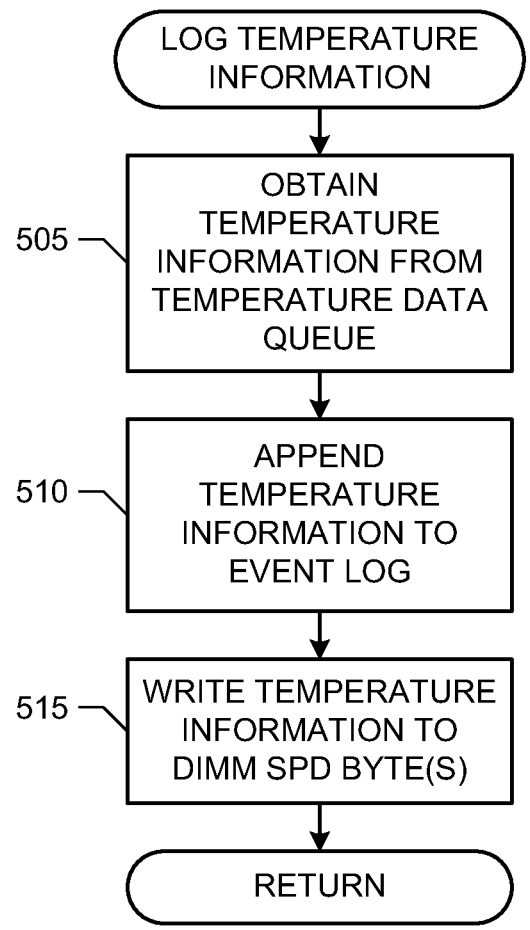
FIG. 5 is representative of example machine-accessible instructions that may be executed by, for example, one or more processors, to log temperature-induced memory error information and/or to implement a portion of the example BMC of FIGS. 1 and 2
Figure 6:
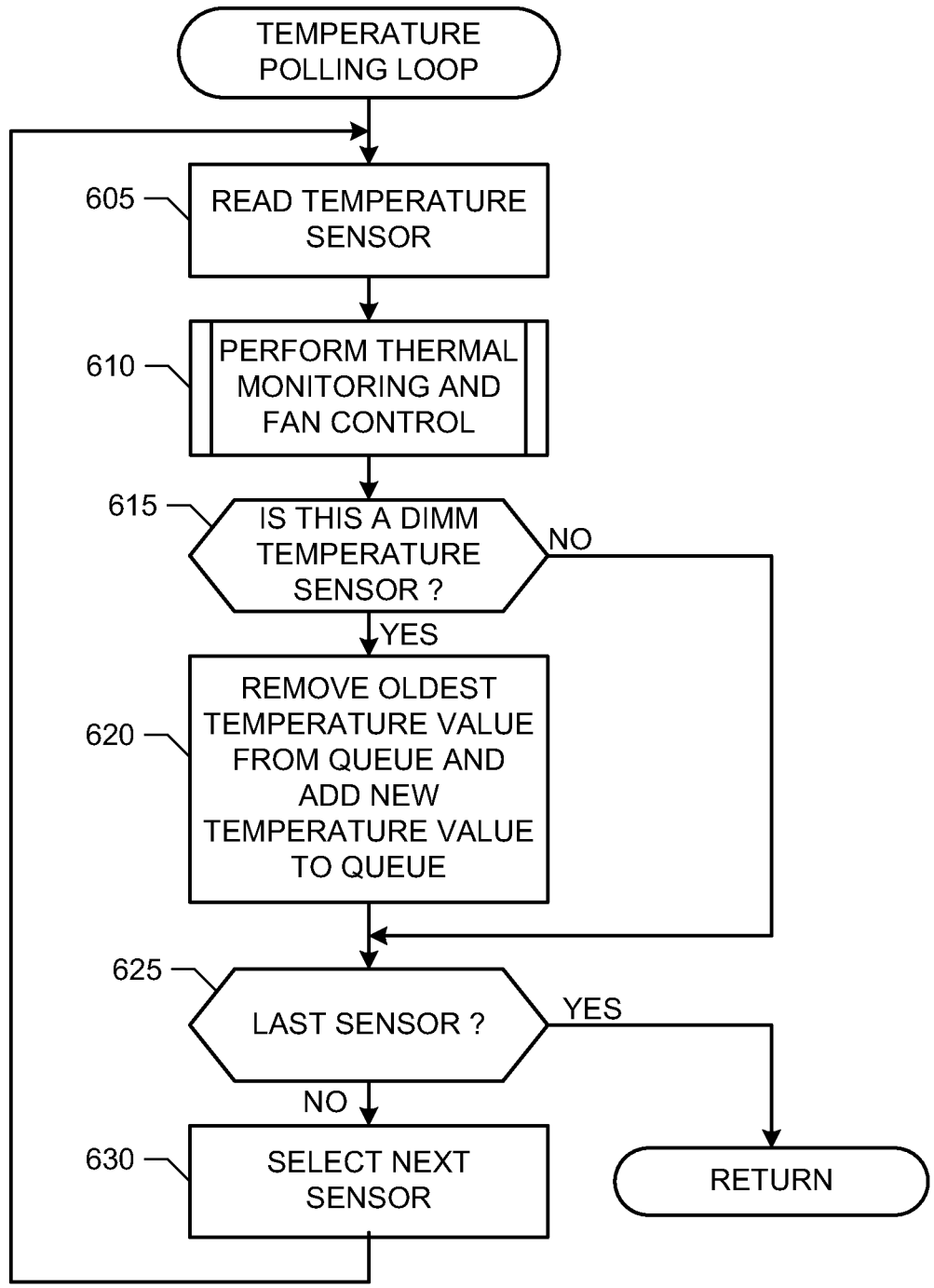
FIG. 6 is representative of example machine-accessible instructions that may be executed by, for example, one or more processors, to gather historical temperature information and/or to implement a portion of the example BMC of FIGS. 1 and 2
Figure 7:
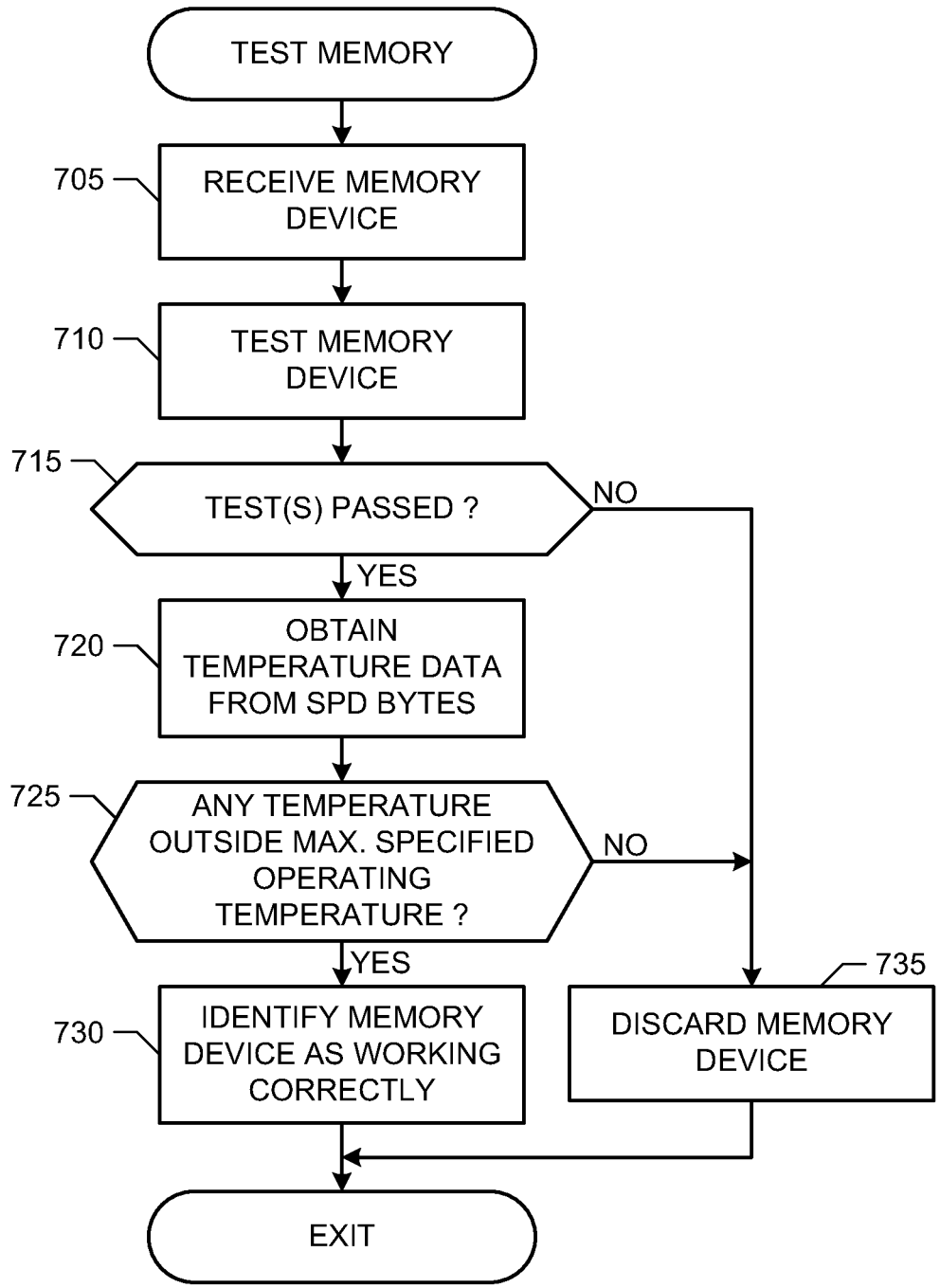
FIG. 7 is representative of example machine-accessible instructions that may be executed by, for example, one or more processors, to determine whether an excessive temperature may have induced a memory error.

FIG. 3 illustrates example machine-accessible instructions that may be executed to implement the example computer 100 of FIG. 1. FIG. 4 illustrates example machine-accessible instructions that may be executed to implement the example run-time module 135 of FIG. 1. FIGS. 5 and 6 illustrate example machine-accessible instructions that may be executed to implement a portion of the example BMC 140 of FIGS. 1 and 2. FIG. 7 illustrates example machine-accessible instructions that may be executed to determine whether an excessive temperature may have induced a memory error. A processor, a controller and/or any other suitable processing device may be used, configured and/or programmed to execute the example machine-accessible instructions of FIGS. 3, 4, 5, 6 and/or 7. For example, the machine-accessible instructions of FIGS. 3, 4, 5, 6 and/or 7 may be embodied in coded instructions stored on a tangible computer-readable medium and/or a machine-accessible medium such as a flash memory, a compact disc (CD), a digital versatile disc (DVD), a floppy disk, a read-only memory (ROM), a random-access memory (RAM), a programmable ROM (PROM), an electronically-programmable ROM (EPROM), and/or an electronically-erasable PROM (EEPROM), an optical storage disk, an optical storage device, magnetic storage disk, a magnetic storage device, and/or any other tangible medium that can be used to store program code and/or instructions in the form of machine-readable instructions or data structures, and which can be accessed by a processor, a computer and/or other machine having a processor, such as the example processor platform P100 discussed below in connection with FIG. 8. Machine-readable instructions comprise, for example, instructions and data that cause a processor, a computer and/or a machine have a processor to perform one or more particular processes. Alternatively, some or all of the example machine-accessible instructions of FIGS. 3, 4, 5, 6 and/or 7 may be implemented using any combination(s) of ASIC(s), PLD(s), FPLD(s), FPGA(s), discrete logic, hardware, firmware, etc. Also, some or all of the example process of FIGS. 3, 4, 5, 6 and/or 7 may be implemented manually or as any combination of any of the foregoing techniques, for example, any combination of firmware, software, discrete logic and/or hardware. Further, many other methods of implementing the example operations of FIGS. 3, 4, 5, 6 and/or 7 may be employed. For example, the order of execution of the blocks may be changed, and/or one or more of the blocks described may be changed, eliminated, sub-divided, or combined. Additionally, any or all of the example machine-accessible instructions of FIGS. 3, 4, 5, 6 and/or 7 may be carried out sequentially and/or carried out in parallel by, for example, separate processing threads, processors, devices, discrete logic, circuits, etc.

The example machine-accessible instructions of FIG. 3 may be, for example, executed by the example computer 100 of FIG. 1 when a correctable and/or an uncorrectable error is detected by, for example, an operating system or other software executing on the processor 120. The example machine-accessible instructions of FIG. 3 begin with the example run-time module 135 identifying the source of the error and isolating the error to a particular memory device 105 by, for example, executing the example machine-accessible instructions of FIG. 4 (block 305).

The example BMC 140 logs the memory error and the identified source(s) in the management log 145 (block 310). Alternatively, the example processor 120 logs the memory error and the identified source(s) in the management log 145.

If the example BMC 140 is configured to log and/or record measured temperature associated with detected memory errors (block 315), the example error handler 215 stores one or more measured temperatures in the log 145 and/or the memory device 105 by, for example, executing the example machine-accessible instructions of FIG. 5 (block 320).

Using any number and/or type(s) of method(s), logic and/or rule(s), the computer 100 performs appropriate additional error handling such as continuing and/or modifying its operation depending on the type and/or severity of memory error that occurred (block 325). Control then exits from the example machine-accessible instructions of FIG. 3.

The example machine-accessible instructions of FIG. 4 may be executed to identify the source(s) of a detected memory error. The example processor 120 invokes a memory error handler of the example run-time module 135 (block 405). Using any number and/or type(s) of method(s), message(s), interaction(s), logic and/or rule(s), the run-time module 135 interacts with the memory controller 125 to identify the source of the detected memory error (block 410) and to identify the memory device(s) associated with the detected memory error (block 415). The example run-time module 135 sends a memory error notification to the example BMC 140 (block 420). Control then exits from the example machine-accessible instructions of FIG. 4.

The example machine-accessible instructions of FIG. 5 may be executed to log temperature information related to a detected memory error. The example machine-accessible instructions begin with the example error handler 215 obtaining, selecting and/or identifying measured temperature values from the queue(s) 210 for the affected memory device(s) (block 505). In some examples, the highest measured temperature contained in the queue 210 is selected. In other examples, some or all of the measured temperatures in the queue 210 are selected.

The error handler 215 appends the selected measured temperature(s) to the management log (block 510), and writes the highest measured temperature to the non-volatile SPD bytes 115 in the identified memory device(s) 105 (block 520). Control then exits from the example machine-accessible instructions of FIG. 5.

The example machine-accessible instructions of FIG. 6 may be executed to implement a temperature polling loop for the example BMC 140 of FIGS. 1 and 2. The example machine-accessible instructions of FIG. 6 may be periodically and/or aperiodically executed. The example machine-accessible instructions of FIG. 6 begin with the example poller 205 reading a measured temperature from a sensor (block 605). Based on the measured temperature and/or one or more additional measured temperatures, the example BMC 140 performs thermal monitoring and/or fan control (block 610).

If the presently considered sensor is a memory device temperature sensor 110 (block 615), the poller 205 discards the oldest temperature from the queue 210 and adds the measured temperature to the queue 210 (block 620). If all temperature sensors have been considered (block 625), control exits from the example machine-accessible instructions of FIG. 6. If not all temperature sensors have been considered (block 625), the next example sensor is selected (block 630) and control returns to block 605 to read a measured temperature from the newly selected sensor.

The example machine-accessible instructions of FIG. 7 begin when a memory device 105 is received (block 705) for which a memory error was detected. For example, the example machine-accessible instructions of FIG. 7 may be executed when the memory device is received by the computer and/or memory device manufacturer from, for example, a service and/or returns organization. The memory device 105 is tested using any number and/or type(s) of memory test(s) and/or diagnostic(s) (block 710). If the memory device 150 passes all the tests (block 715), any temperature data available in, for example, SPD bytes of the memory device 105, are obtained from the memory device (block 720). If the obtained temperature data indicates that the memory device was operating outside its specified maximum operating temperature (block 725), the memory device 105 is identified, marked and/or flagged as functional and made available for service (block 725). Control then exits from the example process of FIG. 7.

Returning to block 725, if the obtained temperature data does not indicate that the memory device was operating outside its specified maximum operating temperature (block 725), the memory device 105 is discarded, and/or flagged a potentially faulty (block 735), and control exits from the example process of FIG. 7.

Returning to block 715, if the memory device 150 does not pass all the tests (block 715), the memory device 105 is discarded, and/or flagged a potentially faulty (block 735), and control exits from the example process of FIG. 7.

Figure 8:
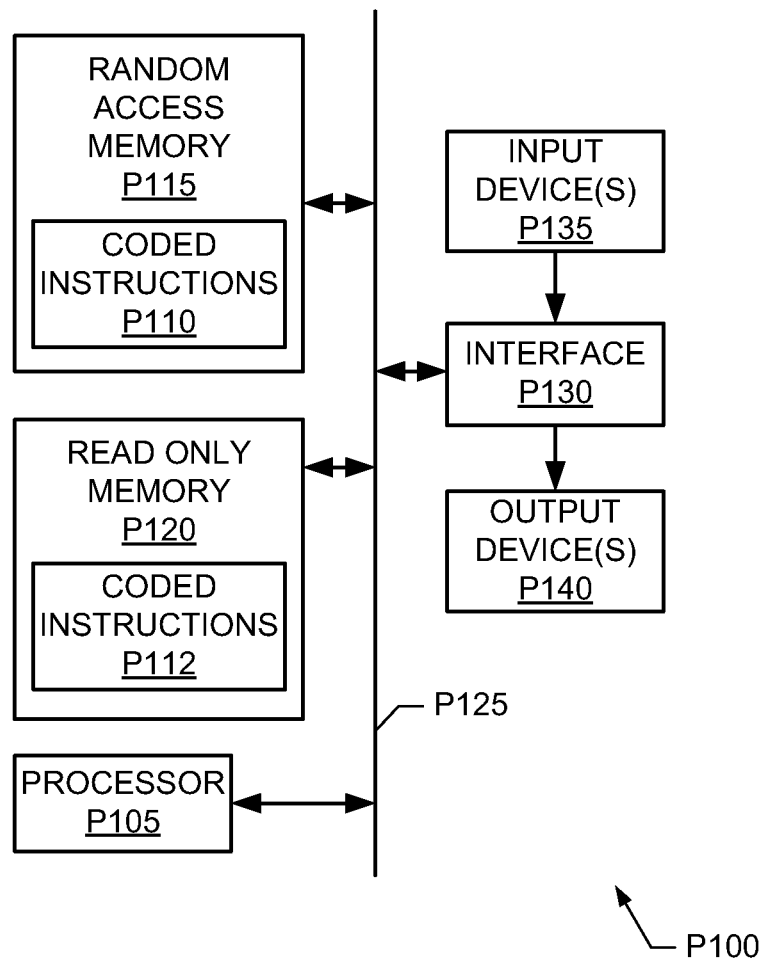
FIG. 8 is a schematic illustration of an example processor platform that may be used and/or programmed to execute the example machine-accessible instructions of FIGS. 3-7 to implement any or all of the example methods, apparatus and/or articles of manufacture described herein.

FIG. 8 is a schematic diagram of an example processor platform P100 that may be used and/or programmed to execute the machine readable instructions represented by FIGS. 3-7 and/or to implement the example computer 100 of FIG. 1. One or more general-purpose processors, processor cores, microcontrollers, etc may be used to implement the processor platform P100.

The processor platform P100 of the example of FIG. 8 includes at least one programmable processor P105. The processor P105 may implement, for example, the processor 120 of FIG. 1. The processor P105 executes coded instructions P110 and/or P112 present in main memory of the processor P105 (e.g., within a RAM P115 and/or a ROM P120). The processor P105 may be any type of processing unit, such as a processor core, a processor and/or a microcontroller. The processor P105 may execute, among other things, the example machine-accessible instructions of FIGS. 3, 4, 5, 6 and/or 7 to diagnose temperature-induced memory errors as described herein. Thus, the coded instructions P110, P112 may include the instructions of FIGS. 3-7.

The processor P105 is in communication with the main memory (including a ROM P120 and/or the RAM P115) via a bus P125. The RAM P115 may be implemented by dynamic random access memory (DRAM), synchronous dynamic random access memory (SDRAM), and/or any other type of RAM device, and ROM may be implemented by flash memory and/or any other desired type of memory device. Access to the memory P115 and the memory P120 may be controlled by a memory controller (e.g., the memory controller 125 of FIG. 1). The example memory P115 may be used to, for example, implement the example queue(s) 210.

The processor platform P100 also includes an interface circuit P130. Any type of interface standard, such as an external memory interface, serial port, general-purpose input/output, etc, may implement the interface circuit P130. One or more input devices P135 and one or more output devices P140 are connected to the interface circuit P130.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent either literally or under the doctrine of equivalents.

What is claimed is:

1. A method to diagnose a temperature-induced memory error, the method comprising:
    storing a queue of measured temperatures associated with a memory device;
    detecting a memory error associated with the memory device; and
    writing, in the memory device when the memory error is detected, a highest measured temperature of the memory device selected from the queue.

2. A method as defined in claim 1, further comprising comparing the highest measured temperature written in the memory device with a maximum specified operating temperature of the memory device to determine whether the memory error comprises a temperature-induced memory error.

3. A method as defined in claim 1, wherein the memory device comprises a dual in-line memory module (DIMM) and the temperature is written in a serial presence detect (SPD) byte of the DIMM.

4. A method as defined in claim 1, wherein the highest measured temperature and an identifier corresponding to the memory device are further written in an event log.

5. A method as defined in claim 1, further comprising:
    performing a functional test of the memory device;
    when the memory device passes the functional test, obtaining the highest measured temperature from the memory device;
    comparing the highest measured temperature to a maximum specified operating temperature of the memory device; and when the highest measured temperature exceeds the maximum specified operating temperature of the memory device, identifying the memory device as operating correctly.

6. A tangible article of manufacture storing machine-readable instructions that, if executed by a machine, cause the machine to:

store a queue of measured temperatures associated with a memory device;

receive an indication of a memory error associated with the memory device; and write, in the memory device when the indication is received, a highest measured temperature of the memory device selected from the queue.

7. A tangible article of manufacture as defined in claim 6, wherein the machine-readable instructions, if executed by the machine, cause the machine to write the highest measured temperature and an identifier corresponding to the memory device in an event log.

8. A tangible article of manufacture as defined in claim 7, wherein the machine-readable instructions, if executed by the machine, cause the machine to write a plurality of temperatures of the memory device preceding the memory error in the event log.

9. A tangible article of manufacture as defined in claim 6, wherein memory device comprises a dual in-line memory module (DIMM), and the machine-readable instructions, if executed by the machine, cause the machine to write the highest measured temperature in a serial presence detect (SPD) byte of the DIMM.

10. An apparatus to diagnose a temperature-induced memory error, the apparatus comprising:

a memory;

a memory controller to identify the memory associated with a detected memory error; and a hardware interface processor comprising a poller to obtain temperatures of the memory device, a queue to store the measured temperatures, and an error handler to write, in the memory device when a memory error is detected, a highest measured temperature stored in the queue.

11. An apparatus as defined in claim 10, wherein the memory device comprises a dual in-line memory module (DIMM), and the error handler is to log the highest measured temperature in a serial presence detect (SPD) byte of the DIMM.

12. An apparatus as defined in claim 10, wherein the error handler is to write a plurality of temperatures from the queue that precede the memory error in an event log.

13. An apparatus as defined in claim 10, wherein the error handler is to write the highest measured temperature and an identifier corresponding to the memory device in an event log.

* * * * *